United States Patent
Hashimoto et al.

(10) Patent No.: US 8,059,445 B2
(45) Date of Patent: Nov. 15, 2011

(54) FERROELECTRIC MEMORY

(75) Inventors: Daisuke Hashimoto, Yokohama (JP);
Daisaburo Takashima, Yokohama (JP);
Hidehiro Shiga, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/563,950

(22) Filed: Sep. 21, 2009

(65) Prior Publication Data

US 2010/0157650 A1    Jun. 24, 2010

(30) Foreign Application Priority Data

Dec. 22, 2008  (JP) .................................. 2008-325195

(51) Int. Cl.
*G11C 11/22* (2006.01)
(52) U.S. Cl. ...................... 365/145; 365/109; 365/49.13; 365/222
(58) Field of Classification Search .................. 365/145, 365/109, 49.13, 222
See application file for complete search history.

(56) References Cited

U.S. PATENT DOCUMENTS

| 5,822,265 A | 10/1998 | Zdenek |
| 5,903,492 A | 5/1999 | Takashima |
| 6,301,145 B1 * | 10/2001 | Nishihara .................. 365/145 |

FOREIGN PATENT DOCUMENTS

JP    2000-011665    1/2000

* cited by examiner

*Primary Examiner* — Thong Q Le
(74) *Attorney, Agent, or Firm* — Knobbe Martens Olson & Bear LLP

(57) ABSTRACT

A ferroelectric memory according to an embodiment of the present invention includes a memory cell array including plural memory cells, and provided with plural word lines, plural bit lines, and plural plate lines, each of the plate lines corresponding to at least two of the word lines, an access control circuit configured to perform an access operation to a selected cell which is selected from the memory cells, and a refresh control circuit configured to perform a refresh operation, in a background of the access operation, on a refresh cell which is selected from the memory cells, the refresh control circuit performing the refresh operation when a plate line connected to the selected cell and a bit line connected to the selected cell are at the same potential after the access operation.

20 Claims, 8 Drawing Sheets

FERROELECTRIC MEMORY

CROSS REFERENCE TO RELATED APPLICATION

This application is based upon and claims the benefit of priority from the prior Japanese Patent Application No. 2008-325195, filed on Dec. 22, 2008, the entire contents of which are incorporated herein by reference.

BACKGROUND OF THE INVENTION

1. Field of the Invention

The present invention relates to a ferroelectric memory, for example, to a refresh operation in the ferroelectric memory.

2. Background Art

A ferroelectric memory is a semiconductor memory including a ferroelectric capacitor as a component of a memory cell. In general, the memory cell in the ferroelectric memory includes the ferroelectric capacitor and a cell transistor.

In general, the ferroelectric memory is provided with lines such as word lines, bit lines, and plate lines. In the ferroelectric memory, if the word lines are not associated with the plate lines in one-to-one correspondence, charges stored at a node between the ferroelectric capacitor and the cell transistor poses a problem. The stored charges and their leak become a cause of reliability lowering of the ferroelectric memory.

In a conventional ferroelectric memory, a refresh operation of turning on a word line to release the charges is performed periodically as a measure to counter this problem. However, when performing the refresh operation, it is necessary that the plate line and the bit line have the same potential. Therefore, in the conventional art, the refresh operation cannot be performed in situations where accesses for reading and/or writing are performed frequently.

JP-A 2000-11665 (KOKAI) describes an example of a ferroelectric memory which performs a data reading operation to read binary data from a selected cell, a counter data writing operation to write data which is opposite in a logical level to the read binary data into the selected cell, and an identical data writing operation to write data which is identical in a logical level as the read binary data into the selected cell again, as a sequential refresh operation.

SUMMARY OF THE INVENTION

An aspect of the present invention is, for example, a ferroelectric memory including a memory cell array including plural memory cells, and provided with plural word lines, plural bit lines, and plural plate lines, each of the plate lines corresponding to at least two of the word lines, an access control circuit configured to perform an access operation to a selected cell which is selected from the memory cells, and a refresh control circuit configured to perform a refresh operation, in a background of the access operation, on a refresh cell which is selected from the memory cells, the refresh control circuit performing the refresh operation when a plate line connected to the selected cell and a bit line connected to the selected cell are at the same potential after the access operation.

DESCRIPTION OF THE EMBODIMENTS

Embodiments of the present invention will be described with reference to the drawings.

First Embodiment

Figure 1:
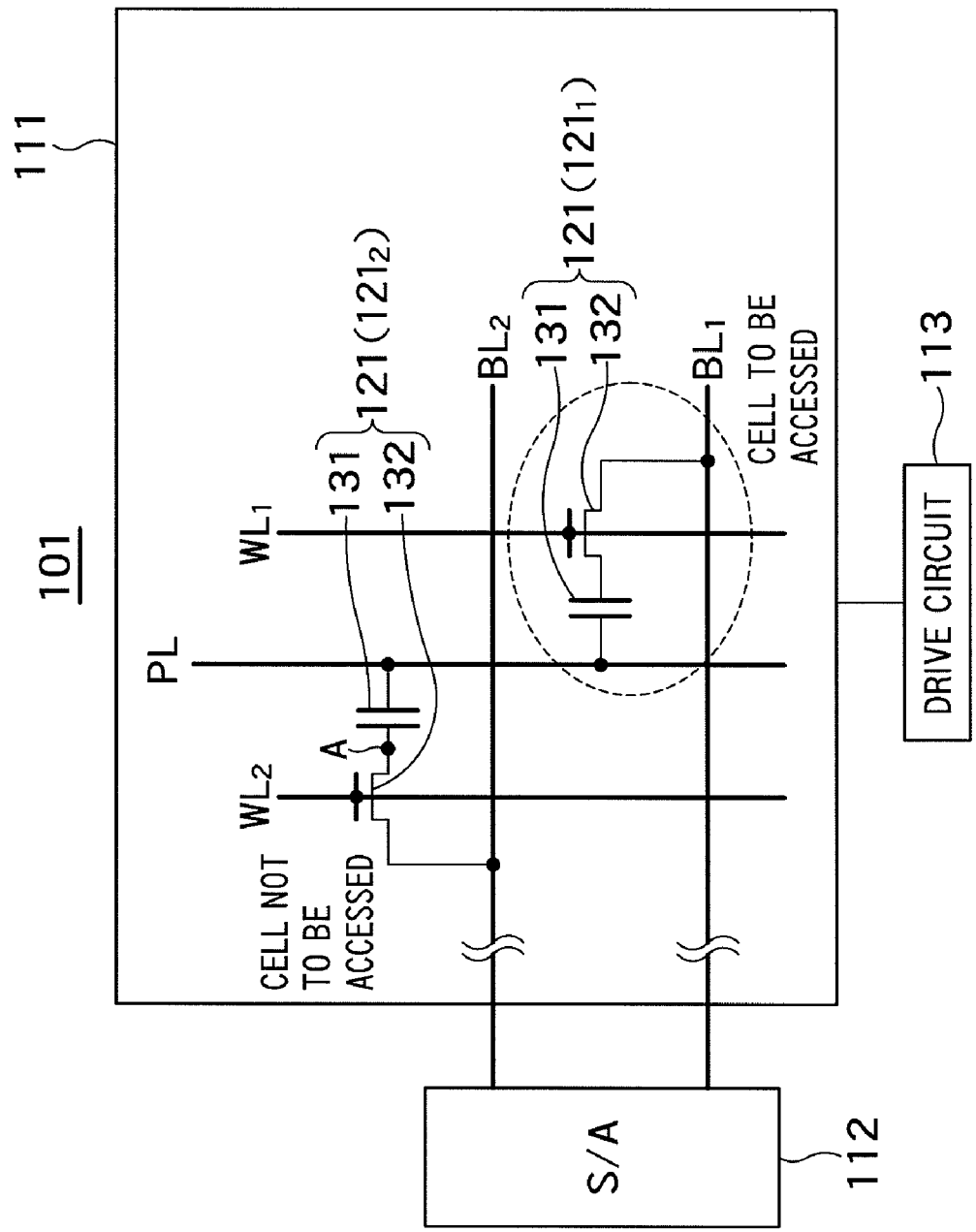
FIG. 1 is a schematic diagram showing a circuit configuration of a ferroelectric memory according to a first embodiment.

FIG. 1 is a schematic diagram showing a circuit configuration of a ferroelectric memory 101 according to a first embodiment. The ferroelectric memory 101 shown in FIG. 1 includes a memory cell array 111, a sense amplifier 112, and a drive circuit 113. The drive circuit 113 is an example of an access control circuit and a refresh control circuit of the present invention.

The memory cell array 111 includes a plurality of memory cells 121. In FIG. 1, a first memory cell $121_1$ and a second memory cell $121_2$ are shown as examples of the memory cells 121. As shown in FIG. 1, each memory cell 121 includes a ferroelectric capacitor 131 and a cell transistor 132.

The memory cell array 111 is further provided with plural word lines, plural bit lines, and plural plate lines. As examples of the word lines, the bit lines, and the plate lines, first and second word lines $WL_1$ and $WL_2$, first and second bit lines $BL_1$ and $BL_2$, and a plate line PL are shown in FIG. 1.

In FIG. 1, $WL_1$ and $WL_2$ are connected to the first memory cell $121_1$ and the second memory cell $121_2$, respectively. Furthermore, $BL_1$ and $BL_2$ are connected to the first memory cell $121_1$ and the second memory cell $121_2$, respectively. On the other hand, PL is connected to both the first memory cell $121_1$ and the second memory cell $121_2$, and is associated with both $WL_1$ and $WL_2$. In this way, in this embodiment, the plate lines are not associated with the word lines in one-to-one correspondence, but are each associated with at least two word lines.

In each memory cell 121 shown in FIG. 1, the ferroelectric capacitor 131 and the cell transistor 132 are connected in series. A first electrode of the ferroelectric capacitor 131 is connected to a plate line, and a second electrode of the ferroelectric capacitor 131 is connected to the cell transistor 132. Further, one of a source and a drain (main terminals) of the cell transistor 132 is connected to the ferroelectric capacitor 131, and the other of the source and the drain of the cell transistor 132 is connected to a bit line. A gate (control terminal) of the cell transistor 132 is connected to a word line.

In FIG. 1, the word lines and the plate lines extend in a first direction, and the bit lines extend in a second direction. Herein, the first direction is the longitudinal direction on paper, and the second direction is the lateral direction on paper. Each memory cell 121 shown in FIG. 1 is provided near an intersection of a word line and a bit line.

As described above, the ferroelectric memory 101 is further provided with the sense amplifier 112 and the drive circuit 113. The sense amplifier 112 is configured to read data stored in a selected cell by detecting and amplifying a potential change on the bit lines. The drive circuit 113 is configured to perform an access operation to the selected cell and a refresh operation on a refresh cell.

In the access operation, a cell to be accessed is selected from the memory cells 121, and the access operation to the cell (selected cell) is performed. In the reading, stored data is read from this cell. When data is to be read from a selected cell, the sense amplifier 112 detects a potential change on a bit line connected to this selected cell. On the other hand, in the refresh operation, a cell to be refreshed is selected from the memory cells 121, and the refresh operation on the cell (refresh cell) is performed.

Figure 2:
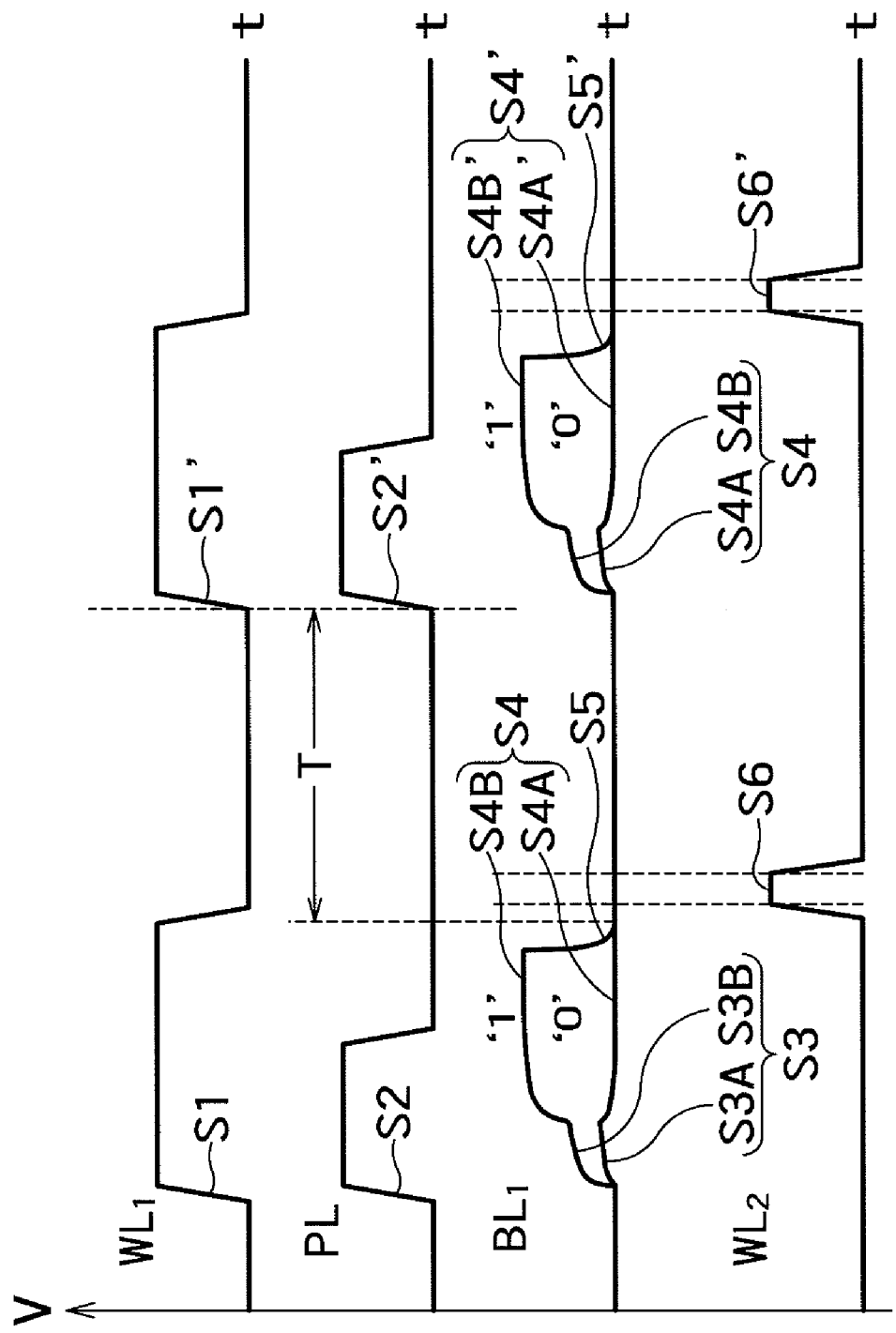
FIG. 2 is a timing chart for explaining an access operation and a refresh operation of the ferroelectric memory according to the first embodiment.

FIG. 2 is a timing chart for explaining the access operation and the refresh operation of the ferroelectric memory 101 shown in FIG. 1. FIG. 2 is a waveform diagram in a case where an access target is the first memory cell $121_1$.

When reading data stored in the first memory cell $121_1$, the ferroelectric memory 101 causes both the potential on $WL_1$ and the potential on PL to become H (high), i.e., makes both $WL_1$ and PL valid (S1 and S2). As a result, the potential on $BL_1$ rises (S3).

If the data stored in the first memory cell $121_1$ is "0" at this time, the potential on $BL_1$ slightly rises (S3A). On the other hand, if the data stored in the first memory cell $121_1$ is "1", the potential on $BL_1$ largely rises (S3B). The sense amplifier 112 reads the data stored in the first memory cell $121_1$ by detecting and amplifying the potential on $BL_1$.

Then, the ferroelectric memory 101 performs a rewriting into the first memory cell $121_1$ (S4). If data to be rewritten is "0", the ferroelectric memory 101 drops the potential on $BL_1$ to a ground potential Vss (S4A). On the other hand, if the data to be rewritten is "1", the ferroelectric memory 101 further raises the potential on $BL_1$ (S4B).

In this way, the ferroelectric memory 101 performs the access operation to the first memory cell $121_1$ by performing processing S1 to S4. In FIG. 2, the access operation is a data read operation (including the rewriting operation). If the data to be rewritten is "1", the ferroelectric memory 101 drops the potential on $BL_1$ to the ground potential Vss after the access operation is finished (S5).

The potential on PL is dropped to the ground potential Vss at the stage of S4. Therefore, in the ferroelectric memory 101, PL and $BL_1$ become the same in potential at the time of S5.

The ferroelectric memory 101 performs processing of S1' to S5' in the same way as the processing of S1 to S5 at the next access operation. In FIG. 2, a time period between S5 and S1' is denoted by T. Over the time period T, PL and $BL_1$ become the same in potential.

In this embodiment, the refresh operation is performed during the time period T. FIG. 2 is the waveform diagram in the case where a refresh target is the second memory cell $121_2$. The ferroelectric memory 101 causes the potential on $WL_2$ to become H (high) during the time period T (S6). As a result, in the second memory $121_2$, charges stored at a node between the capacitor 131 and the transistor 132 is released. In FIG. 1, the node is denoted by "A".

In this way, in this embodiment, the refresh operation is performed when the plate line and the bit line connected to the selected cell are at the same potential after the access operation. In other words, the refresh operation is performed during the time period T shown in FIG. 2.

In this embodiment, this makes it possible to perform the refresh operation in a background of the access operation without interrupting the access operation. This is because the refresh operation is performed during the time period T which is an idle time period for the access operation.

Therefore, in this embodiment, the refresh operation is performed in the background of the access operation by performing it during the time period T. In this embodiment, this enables the refresh operation to be performed without exerting bad influence upon the performance of the access operation.

In this embodiment, the refresh operation is performed during the time period T which is the idle time period for the access operation. Therefore, even in situations where readings and/or writings are performed frequently, the refresh operation can be performed.

Furthermore, in this embodiment, the refresh operation is performed during a time period between an access operation and the next access operation. Therefore, in this embodiment, the refresh operation can be performed per access operation. Therefore, in this embodiment, the number of times of refreshes can be increased as the number of times of accesses increases. In general, the storage of charges takes place every time the access operations are performed. Therefore, as the access operations become frequent, the refresh operations also need to be performed frequently. In this embodiment, therefore, efficient refresh operations can be implemented by increasing the number of times of refreshes as the number of times of accesses in order to cope with such a situation.

In FIG. 2, the selected cell is set to the first memory cell $121_1$, and the refresh cell is set to the second memory cell $121_2$. Therefore, in FIG. 2, the refresh cell is an unselected cell connected to the same plate line as that of the selected cell.

In this embodiment, the refresh cell can be selected randomly from the memory cells 121, for example. At this time, there is a possibility that the refresh cell becomes the selected cell or an unselected cell connected to a plate line which is different from that of the selected cell. However, since the refresh operation can be applied to these cells as well, no problems are posed by such a random selection.

However, if the refresh cell is the unselected cell connected to the plate line which is different from that of the selected cell, the executable time period of the refresh operation can be set wider than the time period T. Such setting will be described later with reference to an embodiment.

In FIG. 2, the refresh operation is performed immediately after the potential on $BL_1$ is dropped to the ground potential Vss. In other words, in FIG. 2, the refresh operation is started immediately after the access operation is finished. However, the refresh operation may be performed at other timing.

As described above, in this embodiment, the refresh operation is performed when the plate line and the bit line connected to the selected cell are at the same potential after the access operation, and the refresh operation is performed in the background of the access operation. In this embodiment, this enables the refresh operation to be performed efficiently.

Comparative Example

Figure 3:
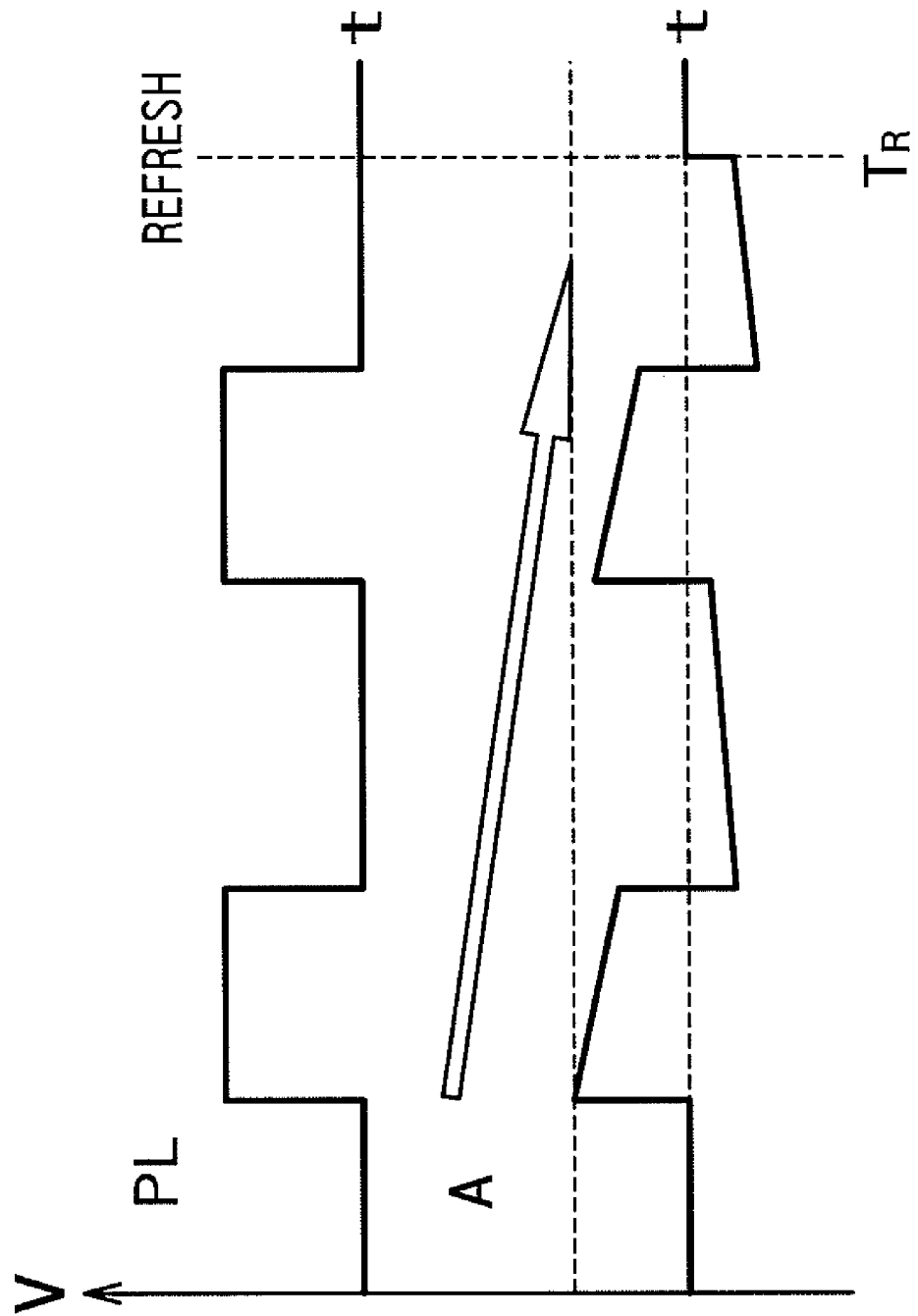
FIG. 3 is a timing chart for explaining an access operation and a refresh operation of a ferroelectric memory according to a comparative example.

FIG. 3 is a timing chart for explaining an access operation and a refresh operation of a ferroelectric memory according to a comparative example. In this ferroelectric memory, refresh operations of turning on word lines to release charges are performed periodically. When performing a refresh operation, it is necessary that the plate line and the bit line are at the same potential. In FIG. 3, when the potential on the plate line PL is L (low), the plate line PL and the bit line are set to the same potential. The refresh operation of turning on the word line to release the charges is performed under this setting.

In this case, it is difficult to perform the refresh operation in situations where accesses for reading and/or writing take place frequently. A potential at a node "A" and a refresh time $T_R$ are shown in FIG. 3. If the number of times of refreshes is small, the potential at the node "A" becomes unstable because of the charge storage, as shown in FIG. 3.

On the other hand, according to the first embodiment, the refresh operation can be performed even in situations where readings and/or writings are performed frequently. As a result, the problem shown in FIG. 3 is dissolved.

Ferroelectric memories 101 according to second to fifth embodiments will be described below. These embodiments are modifications of the first embodiment, and will be described mainly as to points different from those of the first embodiment.

Second Embodiment

Figure 4:
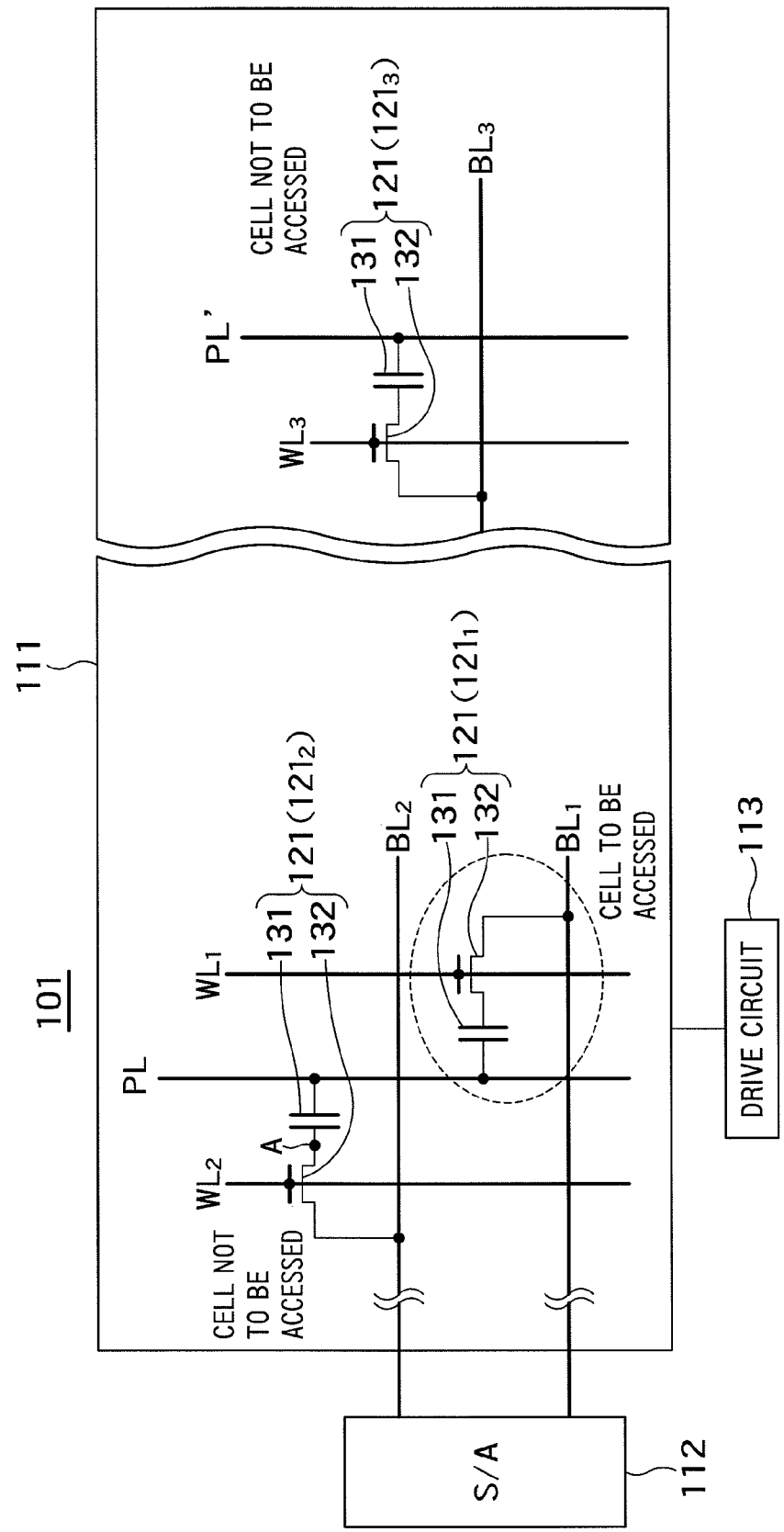
FIG. 4 is a schematic diagram showing a circuit configuration of a ferroelectric memory according to a second embodiment.

FIG. 4 is a schematic diagram showing a circuit configuration of a ferroelectric memory 101 according to a second embodiment. In FIG. 4, a third memory cell $121_3$ is shown in addition to the first and second memory cells $121_1$ and $121_2$. The third memory cell $121_3$ is connected to a third word line $WL_3$ and a third bit line $BL_3$ which differs from the first and second bit lines $BL_1$ and $BL_2$. The third memory cell $121_3$ is further connected to a plate line PL' which differs from the plate line PL.

Figure 5:
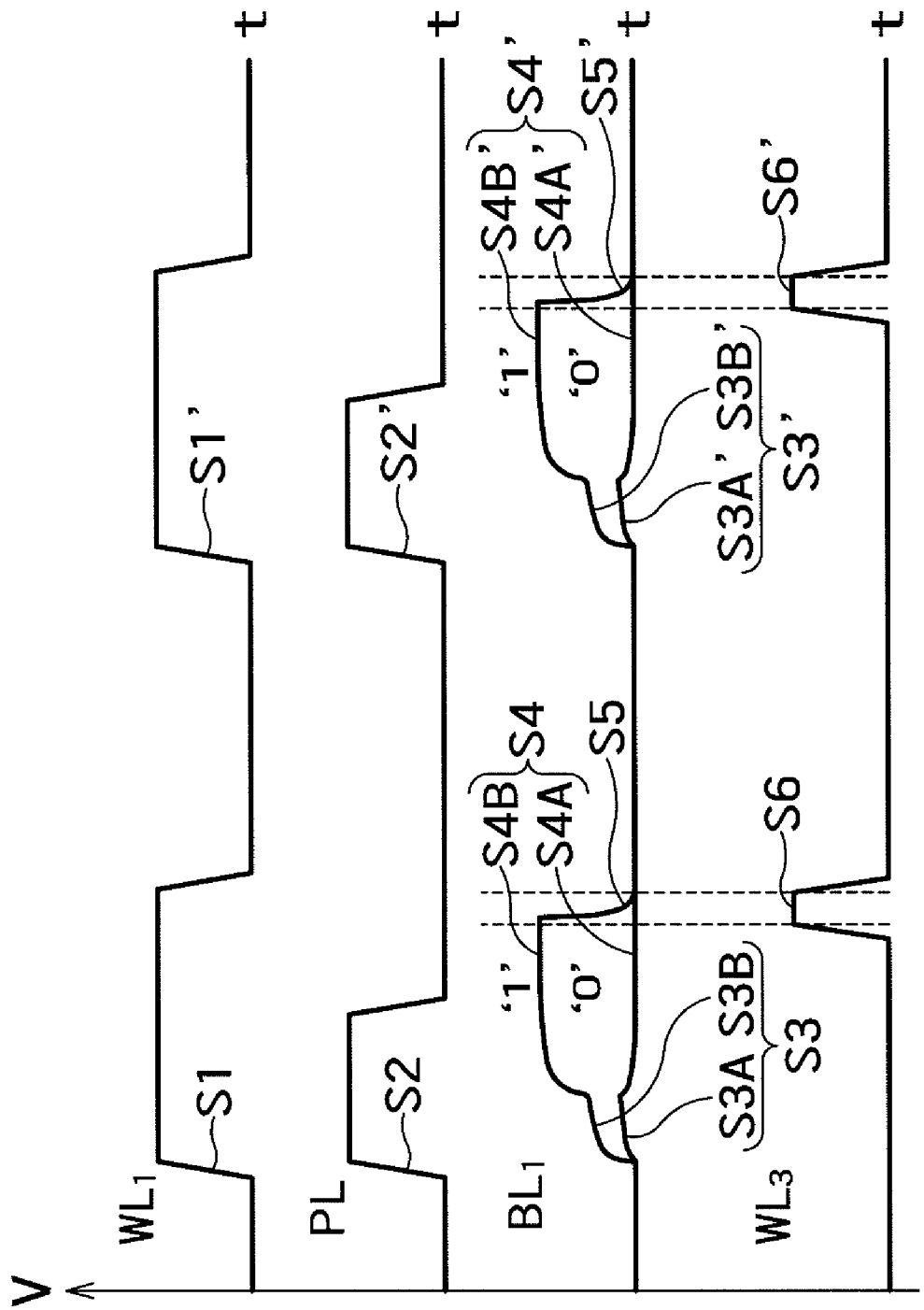
FIG. 5 is a timing chart for explaining an access operation and a refresh operation of the ferroelectric memory according to the second embodiment.

FIG. 5 is a timing chart for explaining an access operation and a refresh operation of the ferroelectric memory 101 shown in FIG. 4. FIG. 5 is a waveform diagram in a case where an access target is the first memory cell $121_1$.

In this embodiment, the refresh operation shown in FIG. 2 is performed, when the refresh cell (refresh target cell) is a memory cell 121 which is connected to the same plate line as that of the selected cell (access target cell). FIG. 2 is the waveform diagram in the case when the refresh target is the second memory cell $121_2$.

On the other hand, in this embodiment, the refresh operation shown in FIG. 5 can be performed, when the refresh cell (refresh target cell) is a memory cell 121 which is connected to a plate line which is different from that of the selected cell (access target cell). FIG. 5 is the waveform diagram in the case where the refresh target is the third memory cell $121_3$.

In FIG. 2, the refresh operation on the refresh target cell is performed, when the plate line and the bit line connected to the access target cell are at the same potential after the access operation to the access target cell, as described above (S6). In other words, the refresh operation is performed during the time period T shown in FIG. 2.

On the other hand, in FIG. 5, the refresh operation on the refresh target cell is performed, when the plate line and the bit connected to the access target cell are at the same potential or are not at the same potential (S6). In other words, in FIG. 5, the refresh operation may be performed after the plate line and the bit line have been at the same potential or before they are at the same potential. This is because the refresh target cell is connected to the plate line different from that of the access target cell. Furthermore, in FIG. 5, a complete background operation may be implemented by performing the refresh operation at the same time that the word line connected to the access target cell turns on. In other words, in FIG. 5, the refresh operation may be started concurrently with the start of the access operation.

In FIGS. 2 and 5, the refresh operation on the refresh target cell is performed when the plate line and the bit line connected to the refresh target cell are at the same potential. The refresh operation shown in FIG. 5 is applied to a memory cell 121 which is connected to a plate line different from the plate line PL and a bit line different from the bit lines $BL_1$ and $BL_2$.

As described above, in this embodiment, if the refresh cell is connected to the plate line different from that of the selected cell, the refresh operation can be performed not only after the access operation but also during the access operation. This embodiment has an advantage that the degree of freedom in setting an execution timing of the refresh operation is high.

On the other hand, the refresh operation may be performed during the time period T no matter which plate line is connected to the refresh cell. Such processing has an advantage that the execution timing of the refresh operation can be unified no matter which plate line is connected to the refresh cell.

Third Embodiment

Figure 6:
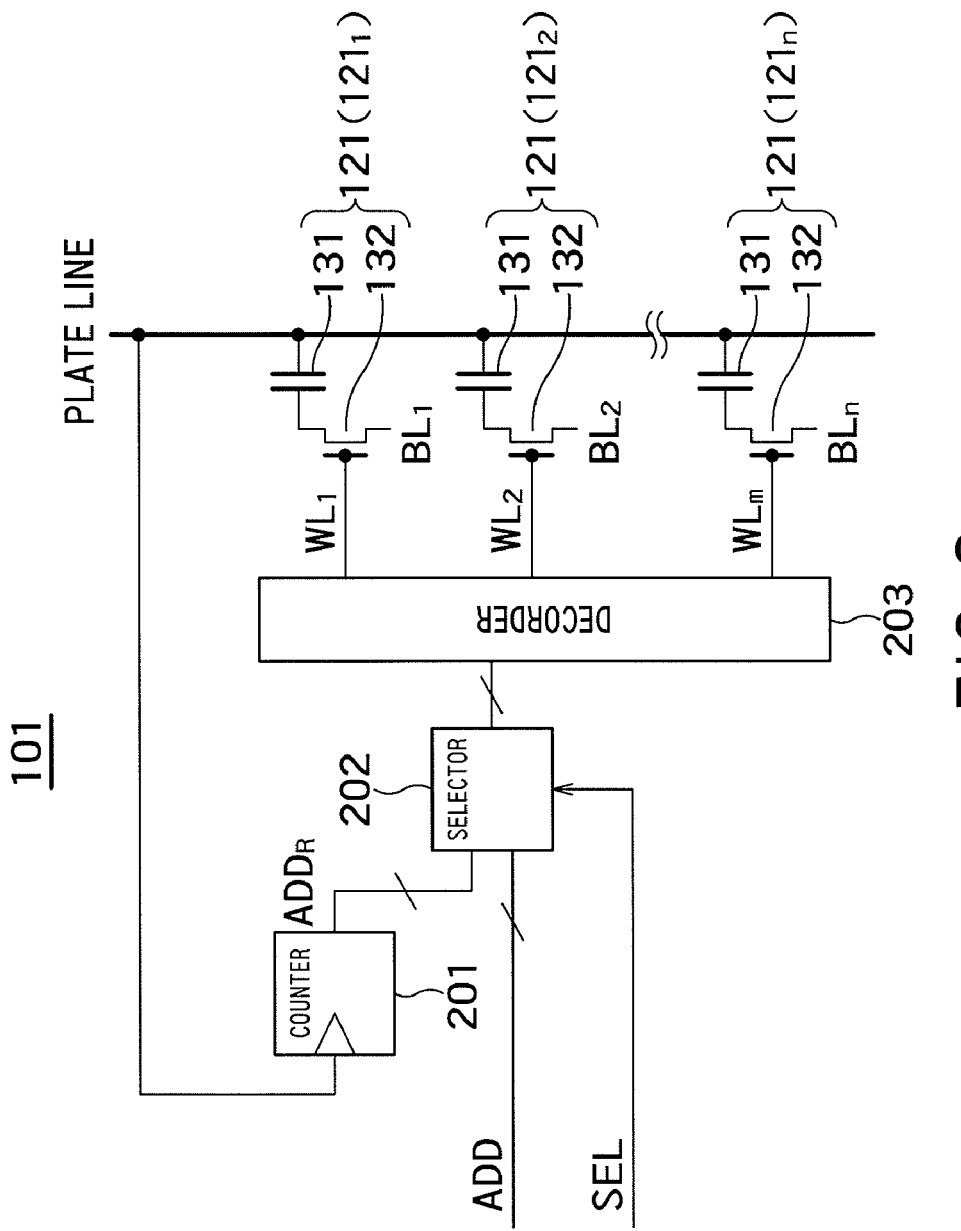
FIG. 6 is a schematic diagram showing a circuit configuration of a ferroelectric memory according to a third embodiment.

FIG. 6 is a schematic diagram showing a circuit configuration of a ferroelectric memory 101 according to a third embodiment. The ferroelectric memory 101 in this embodiment includes a circuit shown in FIG. 6 in addition to the circuit shown in FIG. 1.

As shown in FIG. 6, the ferroelectric memory 101 in this embodiment includes a counter 201, a selector 202, and a decoder 203. The counter 201 is an example of an address generation circuit in the present invention. The counter 201, the selector 202, and the decoder 203 are provided in the drive circuit 113 shown in FIG. 1.

In this embodiment, an address of the refresh cell is generated independently of an address of the selected cell to refresh all memory cells 121 without deviation. It is desirable that the refresh operations have been performed on all memory cells 121 when a predetermined time elapses.

The circuit shown in FIG. 6 is an example of a circuit for performing such refresh operations.

In FIG. 6, the address of the refresh cell is generated by the counter 201. The counter 201 is connected to all plate lines in the memory cell array 111. The counter 201 generates the address of the refresh cell by counting the number of times of variation of potential on these plate lines. Therefore, in this embodiment, the address of the refresh cell changes every access operation.

In a case where the number of the word lines in the memory cell array 111 is m (where m is an integer of at least 2), an m-ary counter is employed as the counter 201 in this embodiment. This makes it possible to cause all of the m word lines to become refresh targets by performing the access operations m times, which makes it easy to refresh the memory cells 121 without deviation.

As shown in FIG. 6, an address signal ADD and a refresh address signal $ADD_R$ are inputted to the selector 202. The address signal ADD is a signal which indicates the address of the selected cell, and is utilized at the time of the access operation. The refresh address signal $ADD_R$ is a signal which indicates the address of the refresh cell, and is utilized at the time of the refresh operation. The refresh address signal $ADD_R$ is generated and outputted by the counter 201. The address signal ADD is an example of a first address signal in the present invention, and the refresh address signal $ADD_R$ is an example of a second address signal in the present invention.

A select signal SEL which specifies an address signal to be selected is also inputted to the selector 202. When the selector 202 receives the select signal indicating that ADD should be selected, it selects and outputs ADD. When the selector 202 receives the select signal indicating that $ADD_R$ should be selected, it selects and outputs $ADD_R$. In this embodiment, it is possible to use the decoder 203 for both the access operation and the refresh operation due to the selector 202.

An address signal selected by the selector 202 is inputted to the decoder 203. When the decoder 203 is supplied with ADD, it turns on a word line indicated by ADD. As a result, a memory cell 121 connected to this word line becomes the access target. On the other hand, when the decoder 203 is supplied with $ADD_R$, it turns on a word line indicated by $ADD_R$. As a result, a memory cell 121 connected to this word line becomes the refresh target.

As described above, in this embodiment, the address of the refresh cell is generated independently of the address of the selected cell. This makes it possible to perform the refresh operations on respective memory cells 121 without deviation. Furthermore, in this embodiment, the address of the refresh cell is generated by the counter 201. This makes it possible to implement the refresh operations whose deviation is suppressed, by using a comparatively simple circuit configuration.

Fourth Embodiment

Figure 7:
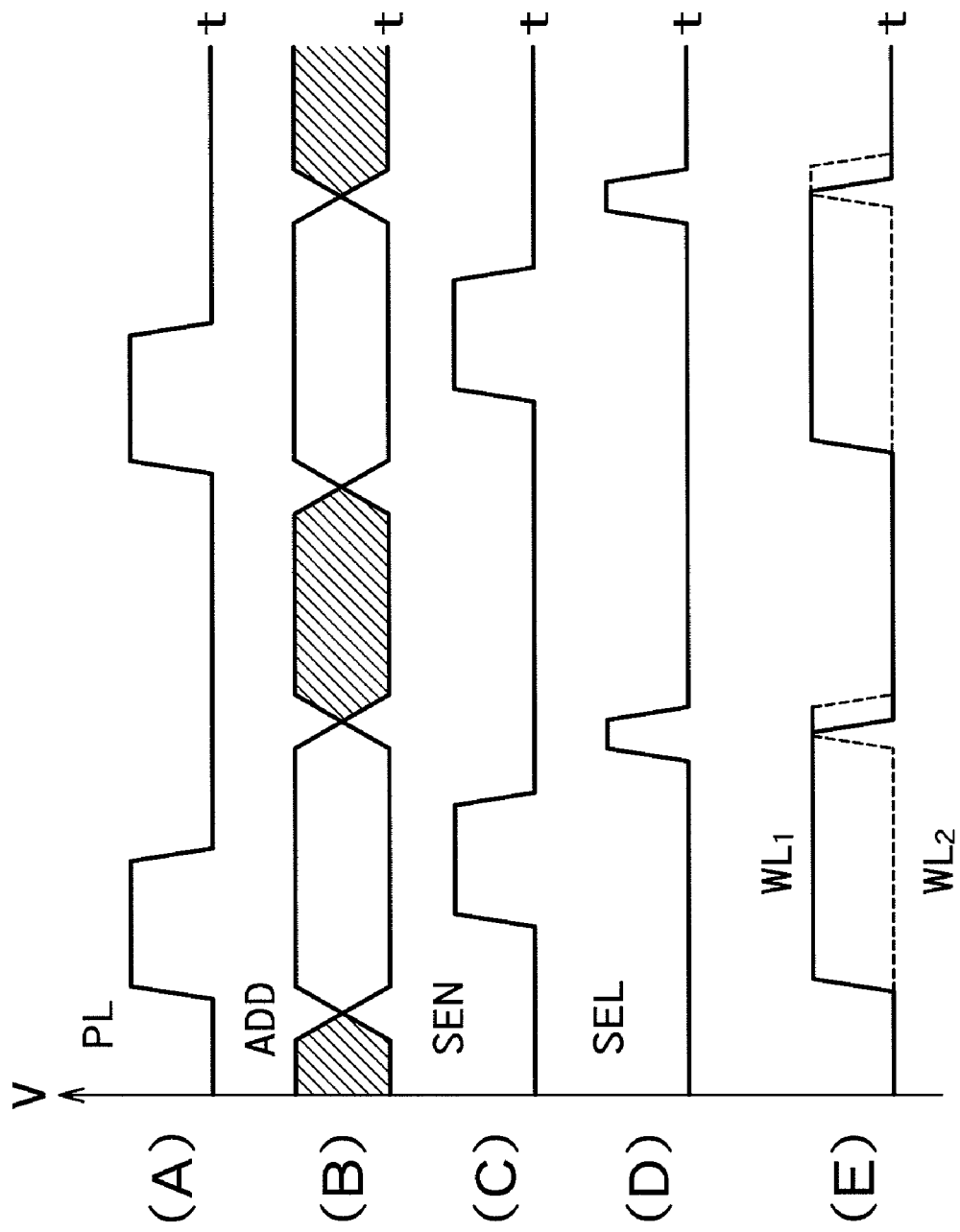
FIG. 7 is a timing chart for explaining an access operation and a refresh operation of a ferroelectric memory according to a fourth embodiment.

FIG. 7 is a timing chart for explaining an access operation and a refresh operation of a ferroelectric memory 101 according to a fourth embodiment. The ferroelectric memory 101 according to this embodiment has the circuit configurations shown in FIGS. 1 and 6.

FIG. 7(A) shows a potential change on the plate line PL. It is similar to the potential change on the plate line PL shown in FIG. 2. FIG. 7(B) shows the address signal ADD. It is now supposed that the selected cell is the first memory cell $121_1$ connected to the word line $WL_1$.

A signal SEN shown in FIG. 7(C) represents a drive signal for the sense amplifier 112. The sense amplifier 112 is brought into an active state to perform the detection and amplification when the drive signal SEN is H (high), i.e., in a valid state. On the other hand, the sense amplifier 112 is brought into an inactive state to stop the detection and amplification when the drive signal SEN is L (low), i.e., in an invalid state.

In the ferroelectric memory 101, the sense amplifier 112 is brought into the inactive state if the drive signal SEN becomes L. Furthermore, in the ferroelectric memory 101, when the sense amplifier 112 is brought into the inactive state, the potential on the bit line connected to the selected cell is dropped to the ground potential Vss as represented by S5 in FIG. 2.

Therefore, in this embodiment, when the drive signal SEN has become L, the select signal SEL is brought to H to change the address signal from ADD to $ADD_R$ (FIG. 7(D)). In this embodiment, such a control makes it possible to perform the refresh operation during the time period T shown in FIG. 2. It is now supposed that the refresh cell is the second memory cell $121_2$ connected to the word line $WL_2$. FIG. 7(E) shows how the word line $WL_2$ turns on in response to the change of the select signal SEL to H.

As described above, in this embodiment, the refresh operation is performed when the sense amplifier 112 is inactive. In this embodiment, this makes it possible to perform the refresh operation during the time period T.

Fifth Embodiment

Figure 8:
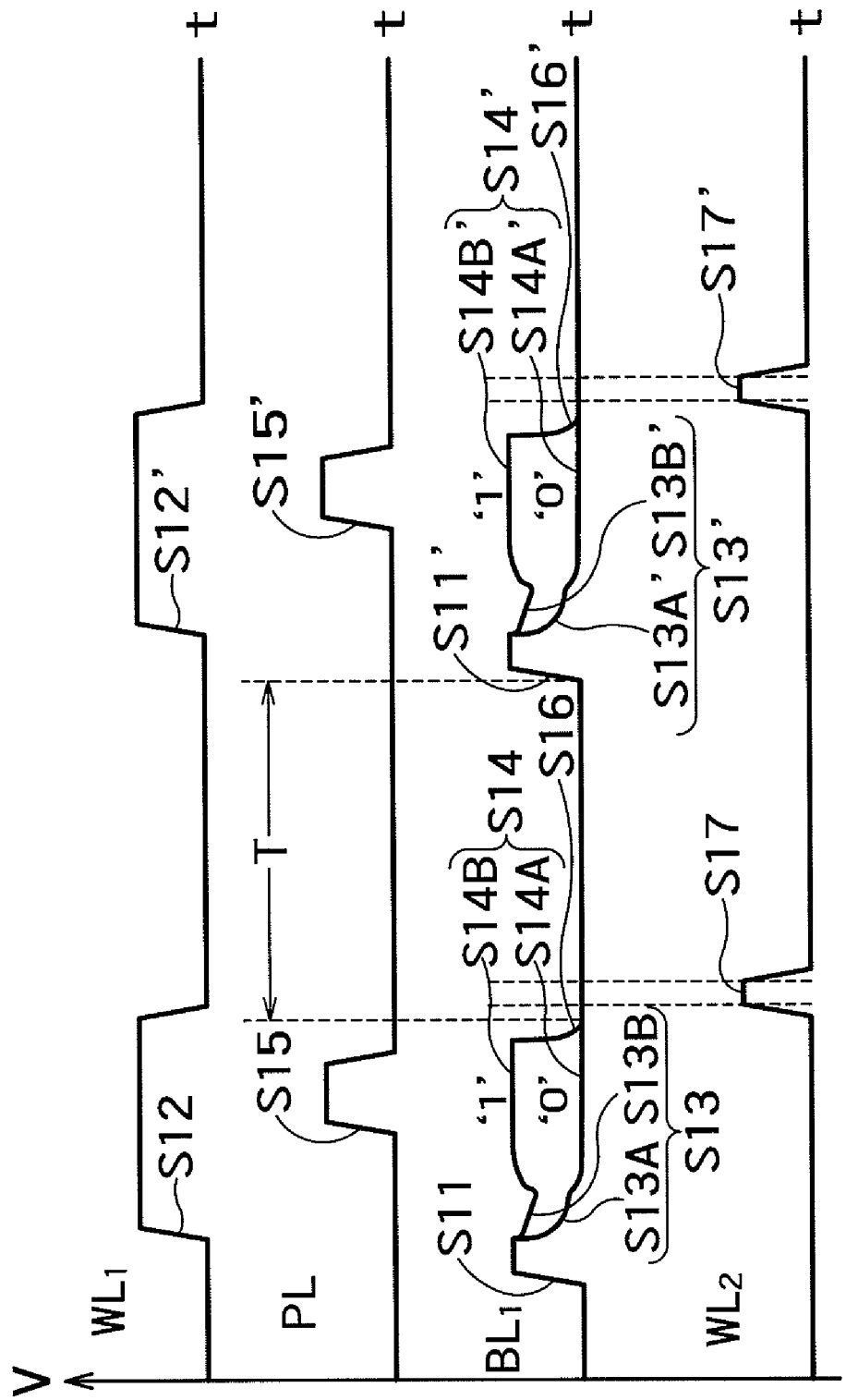
FIG. 8 is a timing chart for explaining an access operation and a refresh operation of a ferroelectric memory according to a fifth embodiment.

FIG. 8 is a timing chart for explaining an access operation and a refresh operation of a ferroelectric memory 101 according to a fifth embodiment. The ferroelectric memory 101 according to this embodiment has the circuit configurations shown in FIGS. 1 and 6.

Whereas the access operation shown in FIG. 2 is a plate line drive type, the access operation shown in FIG. 8 is a bit line drive type.

When the data stored in the first memory cell $121_1$ is to be read, the ferroelectric memory 101 of this embodiment raises the potential on $BL_1$ (S11), and then turns the potential on $WL_1$ H (S12). As a result, the potential on $BL_1$ falls (S13).

At this time, if the data stored in the first memory cell $121_1$ is "0", the potential on $BL_1$ falls greatly (S13A). On the other hand, if the data stored in the first memory cell $121_1$ is "1", the potential on $BL_1$ falls slightly (S13B). The sense amplifier 112 reads the data stored in the first memory cell $121_1$ by detecting and amplifying the potential on $BL_1$.

Then, the ferroelectric memory 101 performs a rewriting into the first memory cell $121_1$ (S14). If data to be rewritten is "0", the ferroelectric memory 101 drops the potential on $BL_1$ to the ground potential Vss (S14A). On the other hand, if the data to be rewritten is "1", the ferroelectric memory 101 raises the potential on $BL_1$ again (S14B). At the time of the rewriting, the potential on PL is set to H (S15).

In this way, the ferroelectric memory 101 performs the access operation to the first memory cell $121_1$ by performing the processing S11 to S15. In FIG. 8, the access operation is a data read operation (including the rewrite operation). If the data to be rewritten is "1", the ferroelectric memory 101 drops the potential on $BL_1$ to the ground potential Vss after the access operation is finished (S16). Furthermore, the potential on PL is also dropped to the ground potential Vss. Therefore, in the ferroelectric memory 101, PL and $BL_1$ are at the same potential at the time of S16.

The ferroelectric memory 101 performs processing S11' to S16' in the same way as the processing S11 to S16 at the next access operation. In FIG. 8, a time period between S16 to S11' is denoted by T. During the time period T, PL and $BL_1$ are at the same potential.

In this embodiment, the refresh operation is performed during the time period T in the same way as the first embodiment. During the time period T, the ferroelectric memory 101 turns the potential on $WL_2$ to H (S17). Therefore, in the second memory cell $121_2$, charges stored at the node between the capacitor 131 and the transistor 132 are released. In FIG. 1, the node is represented by "A".

As described above, this embodiment makes it possible to execute the refresh operation similar to that in the first embodiment, in the ferroelectric memory 101 of a bit line drive type.

As described above, the embodiments of the present invention enable the refresh operation in the ferroelectric memory to be performed effectively.

Although examples of specific aspects of the present invention have been described with reference to the first to fifth embodiments, the present invention is not restricted to these embodiments.

The invention claimed is:

1. A ferroelectric memory comprising:
a memory cell array comprising plural memory cells, and with plural word lines, plural bit lines, and plural plate lines, the plate lines corresponding to at least two of the word lines;
an access control circuit configured to access a selected cell from the memory cells;
a refresh control circuit configured to refresh an unselected cell from the memory cells, when a plate line connected to the selected cell and a bit line connected to the selected cell are substantially at the same potential after the access operation; and
a sense amplifier configured to detect a potential change on the bit lines in the memory cell array and to amplify the potential change,
wherein the refresh control circuit is configured to refresh the unselected cell when the sense amplifier is inactive.

2. The memory of claim 1, wherein
the refresh control circuit is configured to refresh the unselected cell when the plate line and the bit line connected to the selected cell is substantially at the same potential after the access operation, if the unselected cell and the selected cell are connected to the same plate line, and
the refresh control circuit is configured to refresh the unselected cell, if the unselected cell and the selected cell are connected to different plate lines.

3. The memory of claim 2, wherein
the refresh control circuit is configured to start the refreshing concurrently with a start of the access operation, if the unselected cell and the selected cell are connected to the different plate lines.

4. The memory of claim 1, wherein
the refresh control circuit is configured to refresh the unselected cell by activating a word line connected to the unselected cell, and
the access control circuit is configured to activate a word line and the plate line connected to the selected cell, while reading data stored in the selected cell.

5. The memory of claim 1, wherein
the refresh control circuit is configured to refresh the unselected cell by activating a word line connected to the unselected cell, and
the access control circuit is configured to activate the bit line connected to the selected cell and to activate a word line connected to the selected cell, while reading data stored in the selected cell.

6. The memory of claim 1, further comprising:
an address generation circuit configured to generate an address of the unselected cell independently from an address of the selected cell.

7. The memory of claim 6, wherein
the address generation circuit is a counter configured to generate the address of the unselected cell by counting a number of times of changes of potential on the plate lines in the memory cell array.

8. The memory of claim 6, further comprising:
a selector configured to receive a first address signal indicating the address of the selected cell and a second address signal indicating the address of the unselected cell, and to output either the first or second address signal; and
a decoder configured to receive the first or second address signal outputted from the selector, and to activate a word line indicated by the input address signal.

9. The memory of claim 1, wherein
the memory cells comprise ferroelectric capacitors and cell transistors connected in series,
the ferroelectric capacitor and the cell transistor are connected between any one of the plate lines and any one of the bit lines, and
a control terminal of the cell transistor is connected to any one of the word lines.

10. A ferroelectric memory comprising:
a memory cell array comprising plural memory cells, and with plural word lines, plural bit lines, and plural plate lines, the plate lines corresponding to at least two of the word lines;
an access control circuit configured to access a selected cell from the memory cells; and
a refresh control circuit configured to select a cell transistor of an unselected cell from the memory cells to refresh the unselected cell, when a plate line connected to the unselected cell and a bit line connected to the unselected cell are substantially at the same potential.

11. The memory of claim 10, further comprising:
a sense amplifier configured to detect a potential change on the bit lines in the memory cell array and to amplify the potential change,
wherein the refresh control circuit is configured to refresh the unselected cell when the sense amplifier is inactive.

12. The memory of claim 10, further comprising:
a sense amplifier configured to detect a potential change on the bit lines in the memory cell array and to amplify the potential change,
wherein the refresh control circuit is configured to refresh the unselected cell after an activation of a word line connected to the select cell and before an inactivation of the sense amplifier.

13. The memory of claim 10, wherein
the refresh control circuit is configured to refresh the unselected cell when the plate line and the bit line connected to the selected cell is substantially at the same potential after the access operation, if the unselected cell and the selected cell are connected to the same plate line, and
the refresh control circuit is configured to refresh the unselected cell, if the unselected cell and the selected cell are connected to different plate lines.

14. The memory of claim 13, wherein
the refresh control circuit is configured to start the refreshing concurrently with a start of the access operation, if the unselected cell and the selected cell are connected to the different plate lines.

15. The memory of claim 10, wherein
the refresh control circuit is configured to refresh the unselected cell by activating a word line connected to the unselected cell, and
the access control circuit is configured to activate a word line and the plate line connected to the selected cell, while reading data stored in the selected cell.

16. The memory of claim 10, wherein
the refresh control circuit is configured to refresh the unselected cell by activating a word line connected to the unselected cell, and
the access control circuit is configured to activate the bit line connected to the selected cell and to activate a word line connected to the selected cell, while reading data stored in the selected cell.

17. The memory of claim 10, further comprising:
an address generation circuit configured to generate an address of the unselected cell independently from an address of the selected cell.

18. The memory of claim 17, wherein
the address generation circuit is a counter configured to generate the address of the unselected cell by counting a number of times of changes of potential on the plate lines in the memory cell array.

19. The memory of claim 17, further comprising:
a selector configured to receive a first address signal indicating the address of the selected cell and a second address signal indicating the address of the unselected cell, and to output either the first or second address signal; and a decoder configured to receive the first or second address signal outputted from the selector, and to activate a word line indicated by the input address signal.

20. The memory of claim 10, wherein
the memory cells comprise ferroelectric capacitors and cell transistors connected in series,
the ferroelectric capacitor and the cell transistor are connected between any one of the plate lines and any one of the bit lines, and
a control terminal of the cell transistor is connected to any one of the word lines.

* * * * *